US009147759B1

(12) United States Patent
Nagaoka

(10) Patent No.: US 9,147,759 B1
(45) Date of Patent: Sep. 29, 2015

(54) SEMICONDUCTOR DEVICE COMPRISING A MAIN REGION, A CURRENT SENSE REGION, AND A WELL REGION

(71) Applicant: Tatsuji Nagaoka, Nagakute (JP)

(72) Inventor: Tatsuji Nagaoka, Nagakute (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 14/614,991

(22) Filed: Feb. 5, 2015

(30) Foreign Application Priority Data

Mar. 4, 2014 (JP) ................. 2014-041744

(51) Int. Cl.
| H01L 29/00 | (2006.01) |
| H01L 29/739 | (2006.01) |
| H01L 29/417 | (2006.01) |
| H01L 29/423 | (2006.01) |
| H01L 29/06 | (2006.01) |
| H01L 29/66 | (2006.01) |
| H01L 29/10 | (2006.01) |
| H01L 29/78 | (2006.01) |

(52) U.S. Cl.
CPC ........ *H01L 29/7395* (2013.01); *H01L 29/0696* (2013.01); *H01L 29/1095* (2013.01); *H01L 29/41708* (2013.01); *H01L 29/4236* (2013.01); *H01L 29/4238* (2013.01); *H01L 29/66734* (2013.01); *H01L 29/7815* (2013.01); *H01L 2924/13055* (2013.01)

(58) Field of Classification Search
CPC ................. H01L 2924/13055; H01L 29/0696; H01L 29/7815; H01L 29/4238; H01L 29/1095; H01L 29/66734; H01L 29/4236
See application file for complete search history.

(56) References Cited

U.S. PATENT DOCUMENTS

| 5,023,693 A * | 6/1991 | Mori et al. ..................... 257/563 |
| 6,180,966 B1 | 1/2001 | Kohno et al. |
| 2009/0189219 A1* | 7/2009 | Shinbori et al. ............... 257/334 |
| 2010/0219785 A1* | 9/2010 | Hirose et al. .................. 318/519 |
| 2011/0037126 A1* | 2/2011 | Kadow et al. ................. 257/368 |
| 2012/0068296 A1* | 3/2012 | Takaya et al. ................. 257/467 |
| 2013/0009206 A1* | 1/2013 | Soeno ........................... 257/140 |

FOREIGN PATENT DOCUMENTS

| JP | H10-326897 A | 12/1998 |
| JP | 2010-219258 A | 9/2010 |

* cited by examiner

*Primary Examiner* — Ngan Ngo
(74) *Attorney, Agent, or Firm* — Gifford, Krass, Sprinkle, Anderson & Citkowski, P.C.

(57) ABSTRACT

A semiconductor device disclosed herein is configured such that a well region including a well layer is disposed between a main region of a semiconductor substrate and a current sense region of the semiconductor substrate, that a well region electrode is disposed above the well region, and that the well layer and the well region electrode are in contact with each other through a contact hole formed in an interlayer insulating film.

5 Claims, 12 Drawing Sheets

SEMICONDUCTOR DEVICE COMPRISING A MAIN REGION, A CURRENT SENSE REGION, AND A WELL REGION

CROSS-REFERENCE TO A RELATED APPLICATION

This application claims priority to Japanese Patent Application No. 2014-041744 filed on Mar. 4, 2014, the contents of which are hereby incorporated by reference into the present application.

TECHNICAL FIELD

A technology disclosed herein relates to a semiconductor device.

DESCRIPTION OF RELATED ART

Japanese Unexamined Patent Application Publication, No. 10-326897 A discloses a semiconductor device. This semiconductor device includes: a semiconductor substrate including a main region and a current sense region; a main emitter electrode disposed above the main region of the semiconductor substrate; a current sense emitter electrode disposed above the current sense region of the semiconductor substrate; and a lower electrode disposed below the semiconductor substrate. In this semiconductor device, each of the main region and the current sense region includes: a first conductivity type emitter layer exposed at an upper surface of the semiconductor substrate; a second conductivity type body layer disposed below the emitter layer and exposed at the upper surface of the semiconductor substrate; a first conductivity type drift layer disposed below the body layer; a gate electrode disposed inside a trench penetrating the body layer from the upper surface of the semiconductor substrate and reaching the drift layer; a gate insulating film insulating the gate electrode and a wall of the trench; and an interlayer insulating film formed between the upper surface of the semiconductor substrate and a corresponding one of the main emitter electrode and the current sense emitter electrode, and insulating the gate electrode and the corresponding one of the main emitter electrode and the current sense emitter electrode. In this semiconductor device, each of the main region and the current sense region includes a second conductivity type well layer formed on an outer edge thereof and having a depth, which is from the upper surface of the semiconductor substrate to a lower end of the well layer, as deep as the trench of the main region.

BRIEF SUMMARY OF INVENTION

In the semiconductor device of Japanese Unexamined Patent Application Publication, No. 10-326897 A, the well layer formed on the outer edge of the main region and the main emitter electrode are insulated by the interlayer insulating film. For this reason, carriers flowing out of the main region into the well layer flow along the upper surface of the semiconductor substrate and easily effect current crowding in a specific location. This presents a problem of low breakdown resistance at the time of an avalanche breakdown or at the time of a short circuit.

A semiconductor device disclosed herein includes: a semiconductor substrate including a main region, a current sense region, and a well region disposed between the main region and the current sense region; a main emitter electrode disposed above the main region of the semiconductor substrate; a current sense emitter electrode disposed above the current sense region of the semiconductor substrate; a well region electrode disposed above the well region of the semiconductor substrate; and a lower electrode disposed below the semiconductor substrate. In this semiconductor device, each of the main region and the current sense region includes: a first conductivity type emitter layer exposed at an upper surface of the semiconductor substrate; a second conductivity type body layer disposed below the emitter layer and exposed at the upper surface of the semiconductor substrate; a first conductivity type drift layer disposed below the body layer; a gate electrode disposed inside a trench penetrating the body layer from the upper surface of the semiconductor substrate and reaching the drift layer; a gate insulating film insulating the gate electrode and a wall of the trench; and an interlayer insulating film formed between the upper surface of the semiconductor substrate and a corresponding one of the main emitter electrode and the current sense emitter electrode, and insulating the gate electrode and the corresponding one of the main emitter electrode and the current sense emitter electrode. In this semiconductor device, the well region includes: a second conductivity type well layer exposed at the upper surface of the semiconductor substrate and having a depth, which is from the upper surface of the semiconductor substrate to a lower end of the well layer, deeper than the trench of the main region; a first conductivity type drift region disposed below the well layer and being continuous with the drift layer of the main region and the drift region of the current sense region; and an interlayer insulating film formed between the upper surface of the semiconductor substrate and the well region electrode. In this semiconductor device, the well layer and the well region electrode are in contact with each other through a contact hole formed in the interlayer insulating film of the well region.

According to the foregoing semiconductor device, the well region electrode is disposed above the well region, and the well region and the well region electrode are in contact with each other through the contact hole formed in the interlayer insulating film of the well region. For this reason, carriers flowing out of the main region into the well region quickly exit through the contact hole in the interlayer insulting film to the well region electrode. This configuration makes it hard for current crowding to be effected in the semiconductor substrate, thus making it possible to enhance breakdown resistance at the time of an avalanche breakdown or at the time of a short circuit. It should be noted that the well region electrode may be an electrode separate from the main emitter electrode, which conducts with a main emitter electrode in an external circuit, or may be an electrode formed integrally with the main emitter electrode.

DETAILED DESCRIPTION OF INVENTION

Figure 1:
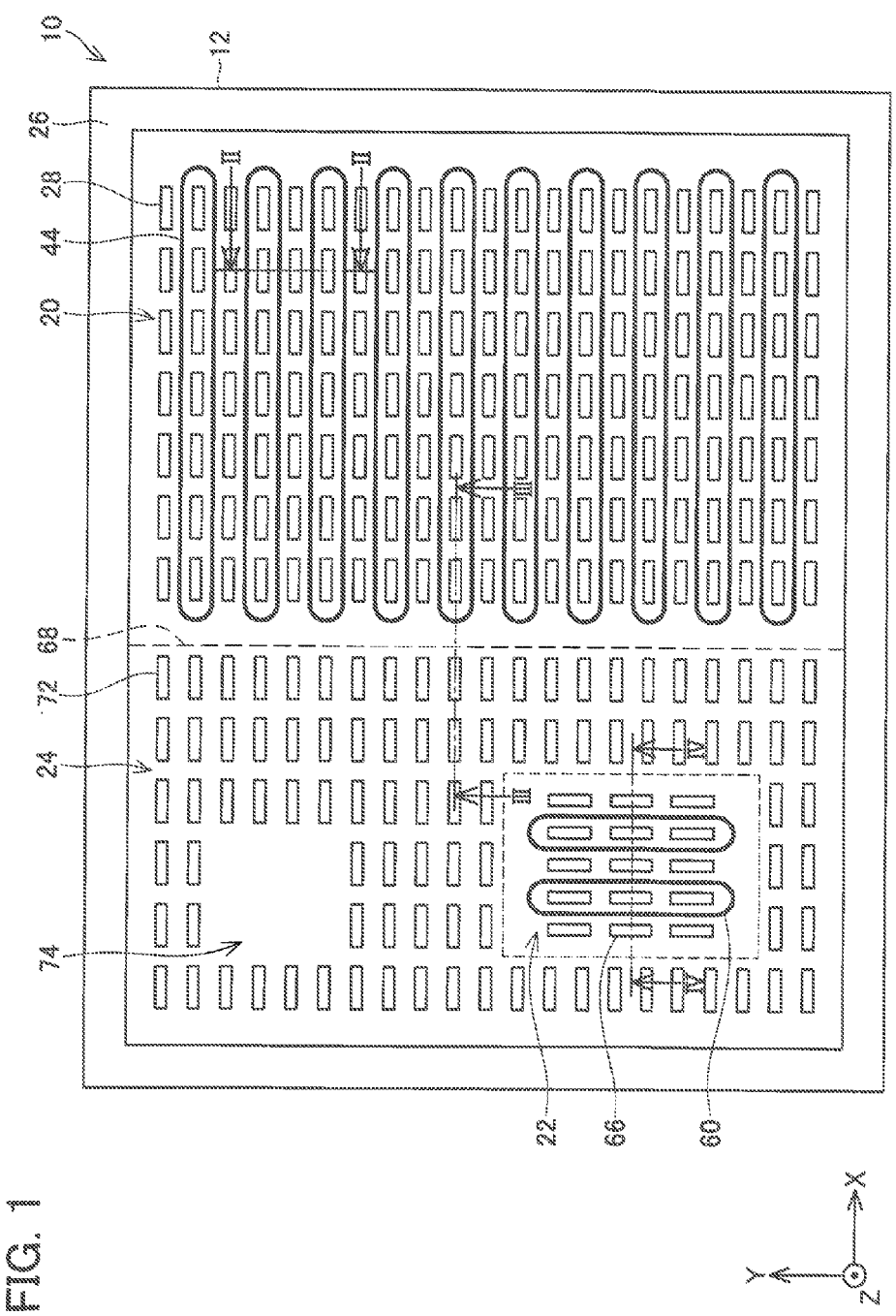
FIG. 1 is a plan view of a semiconductor device 10 of Embodiment 1.

A semiconductor device according to an embodiment may be configured such that the well region is disposed so as to surround the current sense region in a plan view of the semiconductor substrate. This configuration uniforms a current distribution around the current sense region, thereby making it possible to improve detection accuracy in the current sense region.

A semiconductor device according to an embodiment may be configured such that when an X direction is defined as a direction in which the main region, the well region and the current sense region are disposed side by side, a plurality of contact holes are formed in a pattern repeated at a predetermined pitch in the X direction in the interlayer insulating film of the main region, and some of the contact holes in the interlayer insulating film of the well region are formed in a pitch pattern different from the predetermined pitch, and rest of the contact holes are formed in the pattern repeated at the predetermined pitch in the X direction. This configuration makes it possible to, by adjusting the pitch in the X direction of some of the contact holes in the interlayer insulating film of the well region, finely adjust the relative position in the X direction of the current sense region with respect to the main region without effecting a great fluctuation in a current distribution in the well region.

A semiconductor device according to an embodiment may be configured such that when an X direction is defined as a direction in which the main region, the well region and the current sense region are disposed side by side, a trench having a depth deeper than a boundary of the body region and the drift region of the main region is formed along a direction orthogonal to the X direction at a portion where the main region and the well region are adjacent to each other. This configuration interrupts a current pathway between the main region and the current sense region via the well region, thereby making it possible to improve detection accuracy in the current sense region.

A semiconductor device according to an embodiment may be configured such that the current sense region further includes a second conductivity type well layer exposed at the upper surface of the semiconductor substrate and having a depth, which is from the upper surface of the semiconductor substrate to a lower end of the well layer, deeper than the trench of the current sense region, and the well layer of the current sense region is disposed at a portion where the current sense region and the well region are adjacent to each other, and separated from the well layer of the well region via the drift layer. This configuration suppresses the concentration of electric fields in the vicinity of an outer edge of the current sense region, thereby making it possible to make withstand voltage higher.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor device, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Embodiment 1

Figure 2:
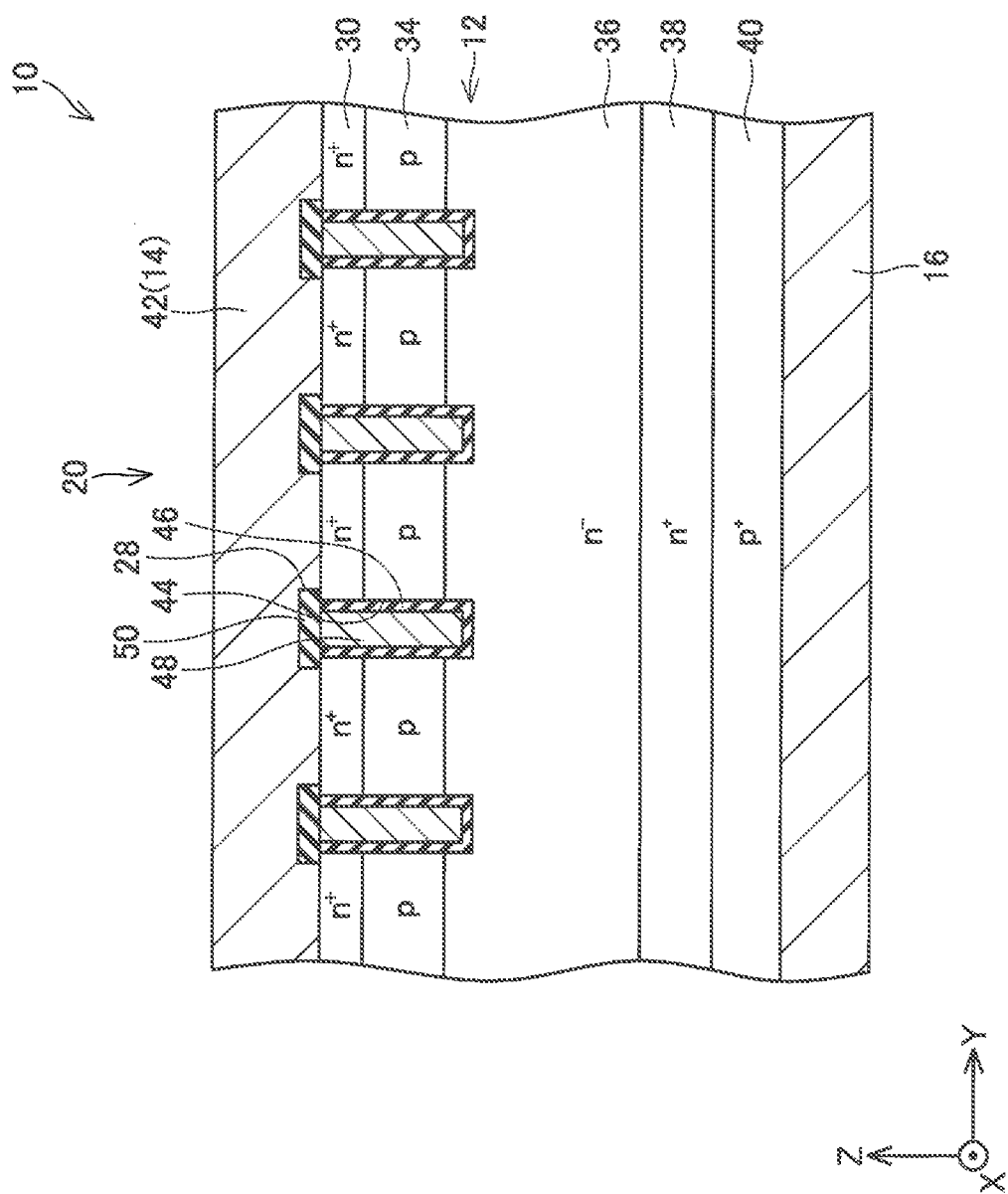
FIG. 2 is a cross-sectional view of the semiconductor device 10 of FIG. 1 as taken along the line II-II.
Figure 3:
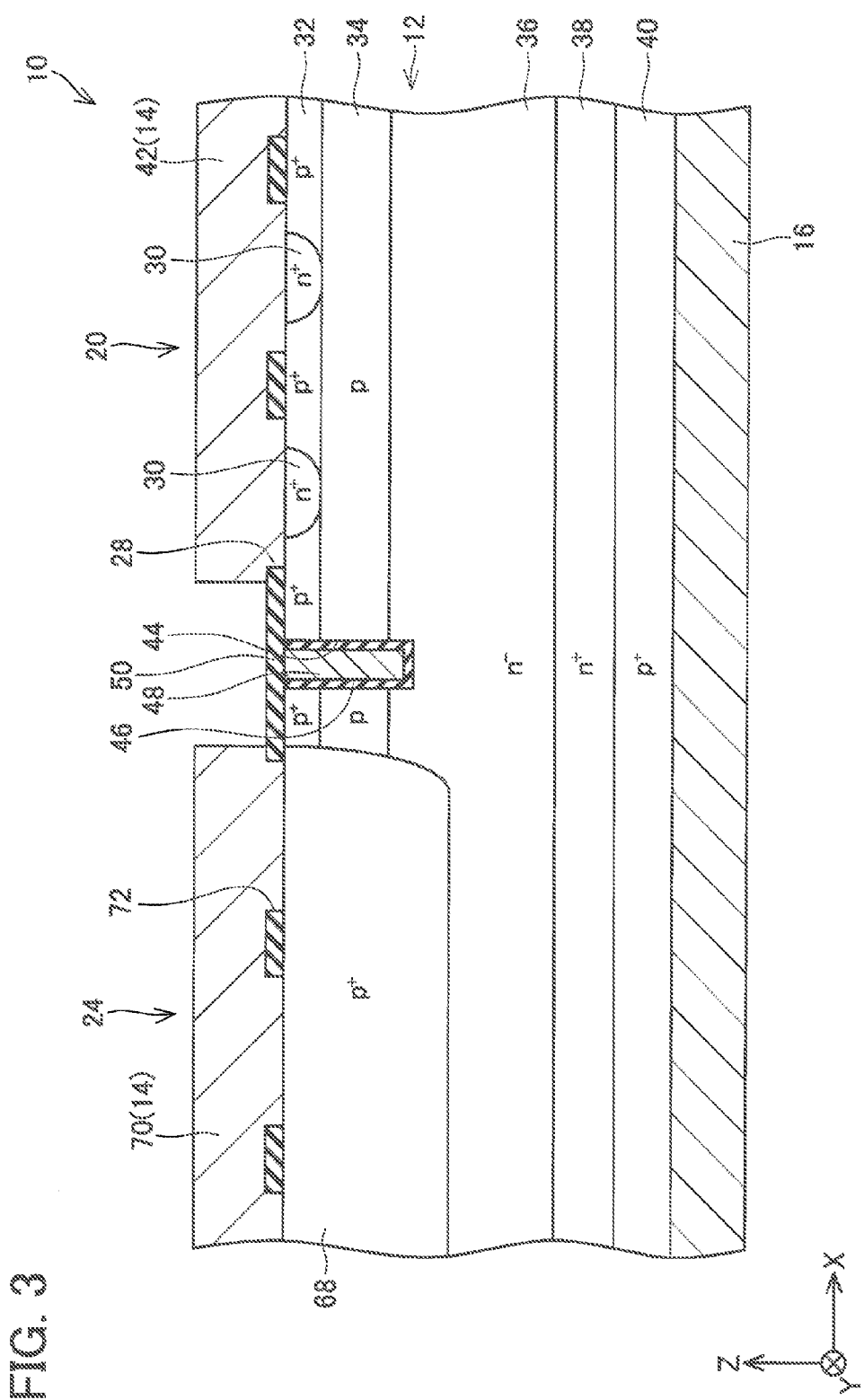
FIG. 3 is a cross-sectional view of the semiconductor device 10 of FIG. 1 as taken along the line III-III.
Figure 4:
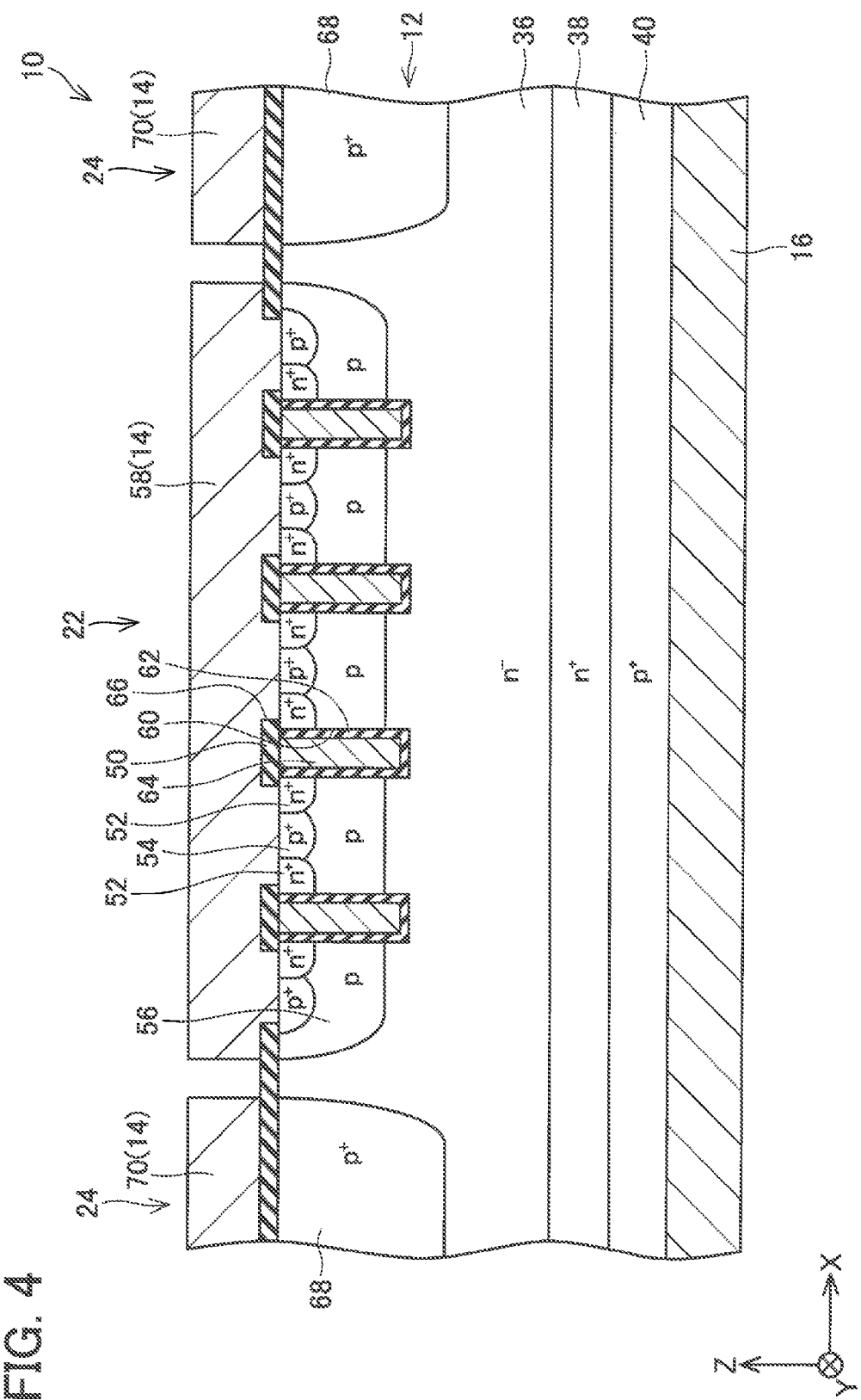
FIG. 4 is a cross-sectional view of the semiconductor device 10 of FIG. 1 as taken along the line IV-IV.

A semiconductor device 10 of the present embodiment is described below with reference to FIGS. 1 to 4. As shown in FIGS. 2 to 4, the semiconductor device 10 includes a semiconductor substrate 12, an upper electrode 14, and a lower electrode 16. The semiconductor substrate 12 is a substrate made of silicon or made of silicon carbide. The upper electrode 14 is formed on an upper surface of the semiconductor substrate 12. The lower electrode 16 is formed on a lower surface of the semiconductor substrate 12. It should be noted that for a clearer illustration, FIG. 1 omits to show the upper electrode 14.

As shown in FIG. 1, the semiconductor substrate 12 includes a main region 20, a current sense region 22, a well region 24, and a peripheral region 26. The main region 20 and the current sense region 22 both function as IGBTs. The main region 20 and the well region 24 are disposed adjacent to each other in an X direction (i.e. a left-to-right direction of FIG. 1). Further, the well region 24 is disposed so as to surround the current sense region 22. That is, the well region 24 can be said to be interposed between the main region 20 and the current sense region 22. Further, the main region 20, the well region 24, and the current sense region 22 can be said to be disposed side by side in the X direction. The peripheral region 26 is disposed so as to surround the main region 20, the current sense region 22, and the well region 24, and has a conventional peripheral voltage withstanding structure such as an RESURF (Reduced Surface Field) structure or an FLR (Field Limiting Ring) structure. That is, the well region 24 can be said to be interposed between the current sense region 22 and the peripheral region 26.

In the main region 20, as shown in FIGS. 2 and 3, an emitter layer 30, a high-concentration body layer 32, a low-concentration body layer 34, a drift layer 36, a buffer layer 38, and a collector layer 40 are formed. On an upper surface of the main region 20 of the semiconductor substrate 12, a main emitter electrode 42, which is part of the upper electrode 14, is formed.

The emitter layer 30 is an n-type semiconductor region. A plurality of such emitter layers 30 are formed in such a range as to be exposed at the upper surface of the semiconductor substrate 12. Each of the emitter layers 30 extends in a Y direction (i.e. a bottom-to-top direction of FIG. 1), and is divided by a trench 44 extending in the X direction (i.e. the left-to-right direction of FIG. 1).

The high-concentration body layer 32 is a p-type semiconductor region. A plurality of such high-concentration body layers 32 are formed in such a range as to be exposed at the upper surface of the semiconductor substrate 12. Each of the high-concentration body layers 32 extends in the Y direction, and is divided by a trench 44 extending in the X direction.

The low-concentration body layer 34 is a p-type semiconductor region. The low-concentration body layer 34 is formed below the emitter layers 30 and the high-concentration body layers 32. The p-type impurity concentration of the low-concentration body layer 34 is lower than the p-type impurity concentration of each of the high-concentration body layers 32. It should be noted that the high-concentration body layers 32 and the low-concentration body layer 34 are also collectively referred to simply as "body layer".

The drift layer 36 is an n-type semiconductor region. The drift layer 36 is formed below the low-concentration body layer 34. The drift layer 36 is separated from the emitter layers 30 and the high-concentration body layers 32 by the low-concentration body layer 34. The n-type impurity concentration of the drift layer 36 is lower than the n-type impurity concentration of each of the emitter layers 30.

The buffer layer 38 is an n-type semiconductor region. The buffer layer 38 is formed below the drift layer 36. The buffer layer 38 is separated from the low-concentration body layer 34 by the drift layer 36. The n-type impurity concentration of the buffer layer 38 is higher than the n-type impurity concentration of the drift layer 36.

The collector layer 40 is a p-type semiconductor region. The collector layer 40 is formed below the buffer layer 38. The collector layer 40 is separated from the drift layer 36 by the buffer layer 38. The p-type impurity concentration of the collector layer 40 is higher than the p-type impurity concentration of the low-concentration body layer 34. The collector layer 40 is exposed at a lower surface of the semiconductor substrate 12. The collector layer 40 is in contact with the lower electrode 16.

In the upper surface of the semiconductor substrate 12 within the main region 20, a plurality of trenches 44 are formed. Each of the trenches 44 extends down to such a depth as to penetrate a corresponding one of the emitter layers 30, a corresponding one of the high-concentration body layers 32, and the low-concentration body layer 34 from the upper surface of the semiconductor substrate 12 and reach the drift layer 36. An inner surface of each of the trenches 44 is covered with a gate insulating film 46. Further, inside each of the trenches 44, a gate electrode 48 is formed. The gate electrode 48 is insulated from the semiconductor substrate 12 by the gate insulating film 46. The gate electrode 48 faces a corresponding one of the emitter layers 30, the low-concentration body layer 34, and the drift layer 36 with the gate insulating film 46 therebetween. On top of the gate electrode 48, an interlayer insulating film 50 is formed. The gate electrode 48 is insulated from the main emitter electrode 42 by the interlayer insulating film 50. As shown in FIG. 1, each of the trenches 44 is formed in a shape having a linear portion extending in the X direction and a semicircular connecting portion connecting adjacent linear portions at both ends.

The emitter layers 30 and the high-concentration body layers 32 are in contact with the main emitter electrode 42 through a plurality of contact holes 28 formed in the interlayer insulating film 50. As shown in FIG. 1, each of the contact holes 28 is in the shape of a rectangle having long sides extending along the X direction and short sides extending along the Y direction. The contact holes 28 are placed side by side at predetermined intervals in the X direction and the Y direction. The main emitter electrode 42, shown in FIGS. 2 and 3, is disposed so as to almost entirely cover the main region 20.

In the current sense region 22 of the semiconductor substrate 12, as shown in FIG. 4, an emitter layer 52, a high-concentration body layer 54, a low-concentration body layer 56, the drift layer 36, the buffer layer 38, and the collector layer 40 are formed. On an upper surface of the current sense region 22 of the semiconductor substrate 12, a current sense emitter electrode 58, which is part of the upper electrode 14, is formed.

The emitter layer 52 is an n-type semiconductor region. A plurality of such emitter layers 52 are formed in such a range as to be exposed at the upper surface of the semiconductor substrate 12. Each of the emitter layers 52 extends in the X direction, and is divided by a trench 60 extending in the Y direction. The n-type impurity concentration of each of the emitter layers 52 is substantially the same as the n-type impurity concentration of each of the emitter layers 30 of the main region 20.

The high-concentration body layer 54 is a p-type semiconductor region. A plurality of such high-concentration body layers 54 are formed in such a range as to be exposed at the upper surface of the semiconductor substrate 12. Each of the high-concentration body layers 54 extends in the X direction, and is divided by a trench 60 extending in the Y direction. The p-type impurity concentration of each of the high-concentration body layers 54 is substantially the same as the p-type impurity concentration of each of the high-concentration body layers 32 of the main region 20.

The low-concentration body layer 56 is a p-type semiconductor region. The low-concentration body layer 56 is formed below the emitter layers 52 and the high-concentration body layers 54. The p-type impurity concentration of the low-concentration body layer 56 is substantially the same as the p-type impurity concentration of the low-concentration body layer 34 of the main region 20. It should be noted that the high-concentration body layers 54 and the low-concentration body layer 56 are also collectively referred to simply as "body layer".

The drift layer 36, the buffer layer 38, and the collector layer 40 continuously extend from the main region 20. The drift layer 36 is formed below the low-concentration body layer 56. The drift layer 36 is separated from the emitter layers 52 and the high-concentration body layers 54 by the low-concentration body layer 56. A lower surface of the collector layer 40 is in contact with the lower electrode 16, which continuously extends from the main region 20.

In the upper surface of the semiconductor substrate 12 within the current sense region 22, a plurality of trenches 60 are formed. Each of the trenches 60 extends down to such a depth as to penetrate a corresponding one of the emitter layers 52, a corresponding one of the high-concentration body layers 54, and the low-concentration body layer 56 from the upper surface of the semiconductor substrate 12 and reach the drift layer 36. An inner surface of each of the trenches 60 is covered with a gate insulating film 62. Further, inside each of the trenches 60, a gate electrode 64 is formed. The gate electrode 64 is insulated from the semiconductor substrate 12 by the gate insulating film 62. The gate electrode 64 faces a corresponding one of the emitter layers 52, the low-concentration body layer 56, and the drift layer 36 with the gate insulating film 62 therebetween. On top of the gate electrode 64, the interlayer insulating film 50 is formed. The gate electrode 64 is insulated from the current sense emitter electrode 58 by the interlayer insulating film 50. As shown in FIG. 1, each of the trenches 60 is formed in a shape having a linear portion extending in the Y direction and a semicircular connecting portion connecting adjacent linear portions at both ends.

The emitter layers 52 and the high-concentration body layers 54 are in contact with the current sense emitter electrode 58 through a plurality of contact holes 66 formed in the interlayer insulating film 50. As shown in FIG. 1, each of the contact holes 66 is in the shape of a rectangle having long sides extending along the Y direction and short sides extending along the X direction. The contact holes 66 are placed side by side at predetermined intervals in the X direction and the Y direction. The current sense emitter electrode 58, shown in FIG. 4, is disposed so as to almost entirely cover the current sense region 22.

In the well region 24, as shown in FIG. 3, a well layer 68, the drift layer 36, the buffer layer 38, and the collector layer 40 are formed. On an upper surface of the well region 24 of the semiconductor substrate 12, a well region electrode 70, which is part of the upper electrode 14, is formed.

The well layer 68 is a p-type semiconductor region. The well layer 68 is formed in such a range as to be exposed at the upper surface of the semiconductor substrate 12. The well layer 68 formed so as to be deeper than the trenches 44 of the main region 20 and the trenches 60 of the current sense region 22. The p-type impurity concentration of the well layer 68 is higher than the p-type impurity concentration of the low-concentration body layer 34 of the main region 20. Further, the p-type impurity concentration of the well layer 68 is such a concentration that when the IGBT of the main region 20 is in an off state, the well layer 68 is depleted only up to the same depth as the trenches 60. That is, in the well layer 68, a depletion layer does not extend to a position shallower than a lower end of each of the trenches 60.

The drift layer 36, the buffer layer 38, and the collector layer 40 continuously extend from the main region 20 and the current sense region 22. The drift layer 36 is formed below the well layer 68. The lower surface of the collector layer 40 is in contact with the lower electrode 16, which continuously extends from the main region 20 and the current sense region 22.

As shown in FIG. 3, at a position where the well region 24 and the main region 20 are adjacent to each other, a side surface of the well layer 68 is in contact with a corresponding one of the high-concentration body layers 32 and the low-concentration body layer 34 of the main region 20. As shown in FIG. 4, at a position where the well region 24 and the current sense region 22 are adjacent to each other, the drift layer 36 is interposed between the well layer 68 and the low-concentration body layer 56 of the current sense region 22. That is, the low-concentration body layer 56 is separated from the well layer 68 by the drift layer 36.

In the well region 24, as shown in FIG. 3, the well layer 68 is in contact with the well region electrode 70 through a plurality of contact holes 72 formed in the interlayer insulating film 50. As shown in FIG. 1, each of the contact holes 72 is in the shape of a rectangle having long sides extending along the X direction and short sides extending along the Y direction. The contact holes 72 are placed side by side at predetermined intervals in the X direction and the Y direction. The contact holes 72 are arranged in a pattern that is substantially identical to a pattern in which the contact holes 28 of the main region 20 are arranged. The well region electrode 70 is disposed so as to almost entirely cover the well region 24. The well region electrode 70 conducts with the main emitter electrode 42 in an external circuit, and is at substantially the same potential as the main emitter electrode 42. It should be noted that in part of the well region 24, a gate pad placing section 74 on which to place a gate pad is formed. In the gate pad placing section 74, no contact holes 72 are formed in the interlayer insulating film 50, nor is a well region electrode 70 formed. The gate pad is placed on an upper surface of the interlayer insulating film 50 within the gate pad placing section 74.

In this semiconductor device 10, the gate electrode 48 of the main region 20 and the gate electrode 64 of the current sense region 22 conduct with each other. Therefore, the IGBT of the main region 20 and the IGBT of the current sense region 22 are turned on at the same time. When the IGBTs are turned on, electrical currents flow through the main region 20 and the current sense region 22, respectively. The ratio between the electrical current flowing through the main region 20 and the electrical current flowing through the current sense region 22 is substantially equal to the ratio between the area of the main region 20 and the area of the current sense region 22. Therefore, the electrical current flowing through the main region 20 can be detected by detecting the electrical current flowing through the current sense region 22.

When the IGBT of the main region 20 and the IGBT of the current sense region 22 are turned off, the drift layer 36 is depleted, so that a high voltage is applied to the drift layer 36. In the semiconductor device 10 of the present embodiment, the well layer 68, which is deeper than the trenches 44 of the main region 20 and the trenches 60 of the current sense region 22, is formed in the well region 24. This causes a distribution of potentials through the drift layer 36 in the well region 24 to become flat for uniform electric field when the IGBTs are off. This makes it possible to make the withstand voltage of the semiconductor device 10 higher without providing a trench in the well region 24.

The semiconductor device 10 of the present embodiment is configured such that the well layer 68 and the well region electrode 70 are in contact with each other through the contact holes 72 formed in the interlayer insulating film 50 of the well region 24. This configuration allows carriers flowing out of the main region 20 into the well region 24 to quickly exit through the contact holes 72 to the well region electrode 70. This makes it hard for current crowding to be effected in a specific location, thus making it possible to enhance breakdown resistance at the time of an avalanche breakdown or at the time of a short circuit.

The semiconductor device 10 of the present embodiment is configured such that the well region 24 is formed so as to surround the current sense region 22 in a plan view of the semiconductor substrate 12. This configuration uniforms a current distribution around the current sense region 22, thereby making it possible to improve detection accuracy in the current sense region 22.

Embodiment 2

A semiconductor device 100 of the present embodiment is described below with reference to FIGS. 5 to 9. It should be noted that those components of the semiconductor device 100 of the present embodiment which are the same as those of the semiconductor device 10 of Embodiment 1 are given the same reference signs, and as such, are not described below in detail. As shown in FIGS. 6 to 9, the semiconductor device 100 includes a semiconductor substrate 102, an upper electrode 104, and a lower electrode 16. It should be noted that for a clearer illustration, FIG. 5 omits to show the upper electrode 104.

Figure 5:
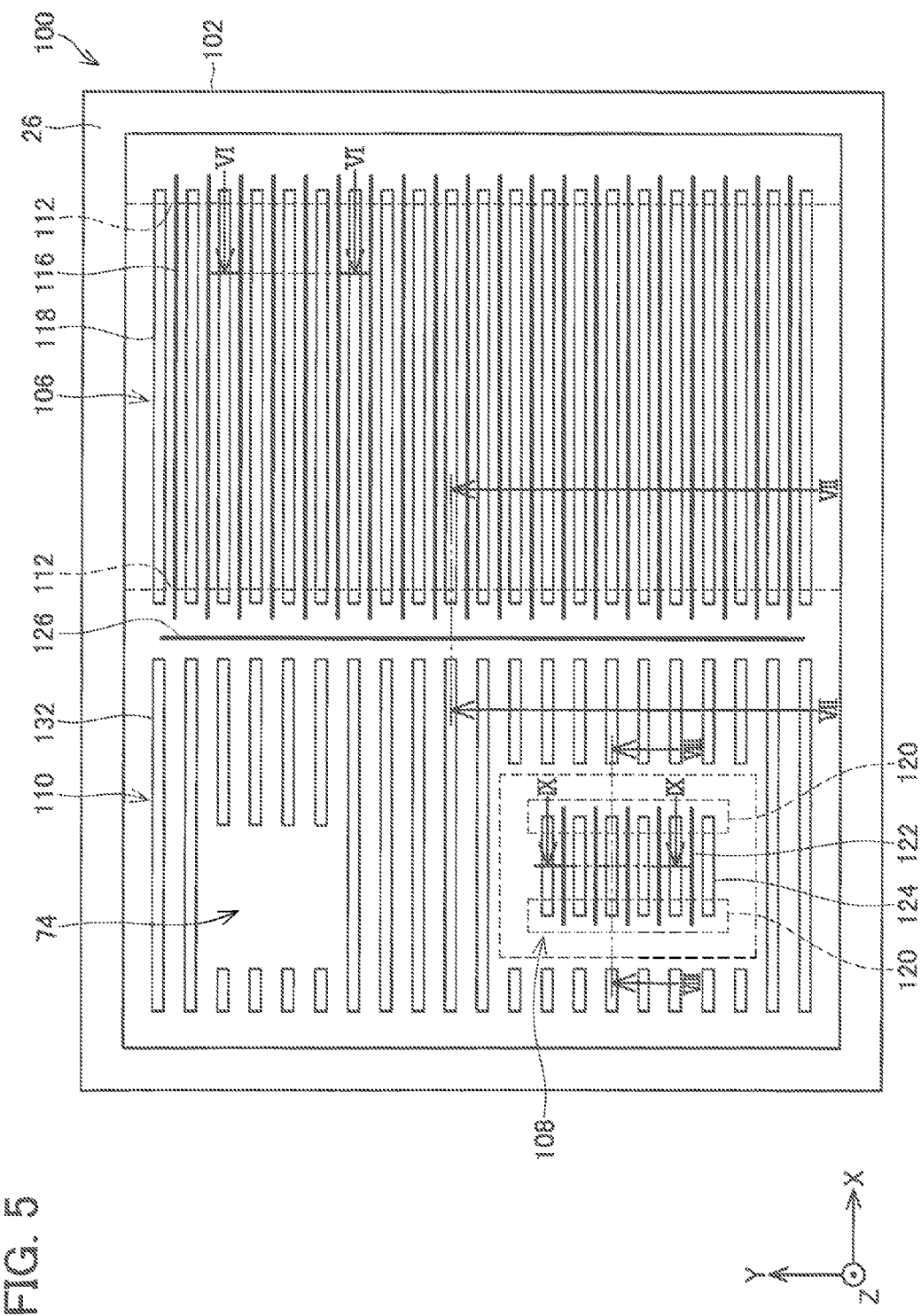
FIG. 5 is a plan view of a semiconductor device 100 of Embodiment 2.

As shown in FIG. 5, the semiconductor substrate 102 includes a main region 106, a current sense region 108, a well region 110, and a peripheral region 26. The main region 106 and the current sense region 108 both function as IGBTs. The main region 106 and the well region 110 are disposed adjacent to each other in an X direction (i.e. a left-to-right direction of FIG. 5). Further, the well region 110 is disposed so as to surround the current sense region 108. That is, the well region 110 can be said to be interposed between the main region 106 and the current sense region 108. Further, the main region 106, the well region 110, and the current sense region 108 can be said to be disposed side by side in the X direction. The peripheral region 26 is disposed so as to surround the main region 106, the current sense region 108, and the well region 110. That is, the well region 110 can be said to be interposed between the current sense region 108 and the peripheral region 26.

Figure 6:
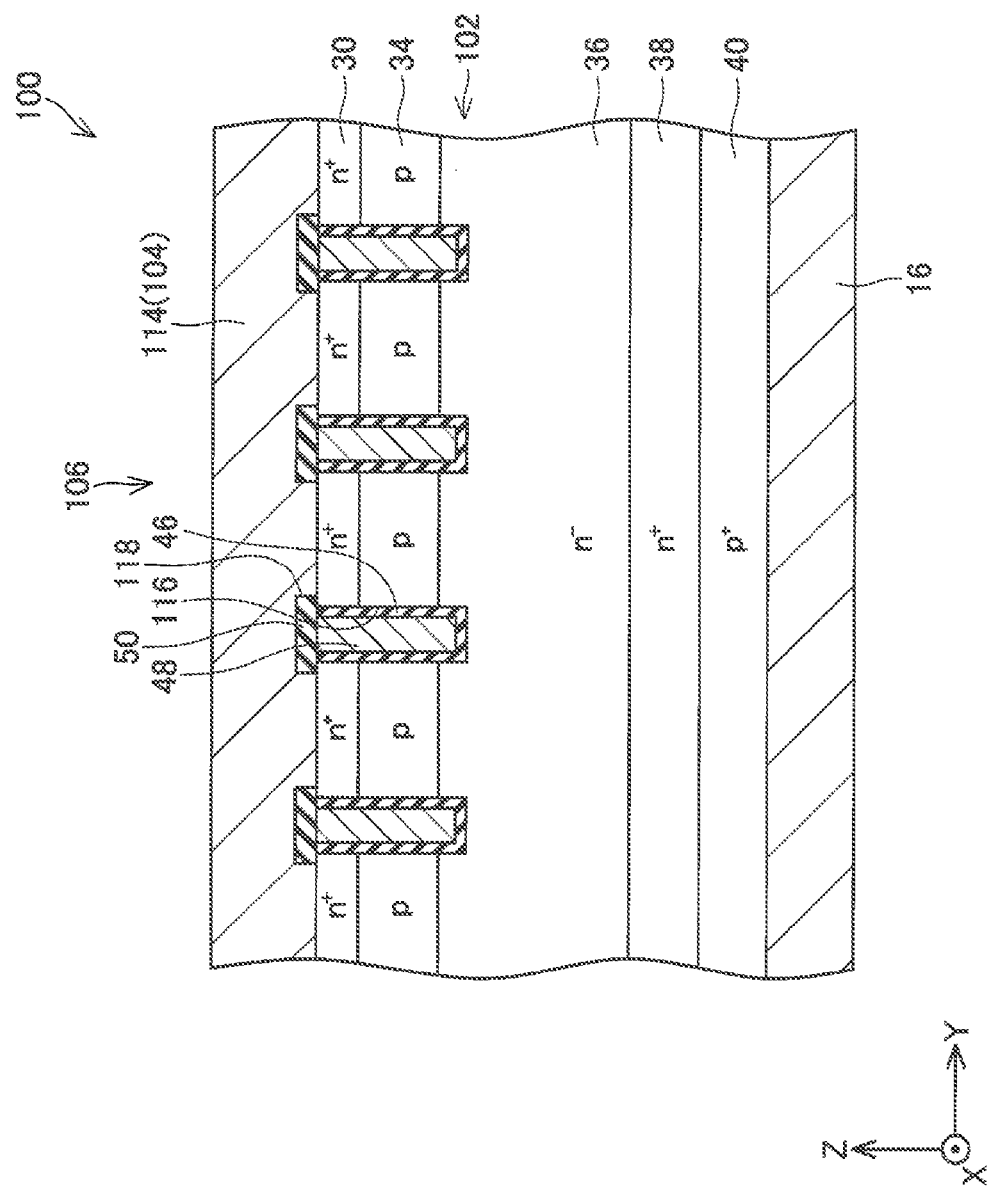
FIG. 6 is a cross-sectional view of the semiconductor device 100 of FIG. 5 as taken along the line VI-VI.
Figure 7:
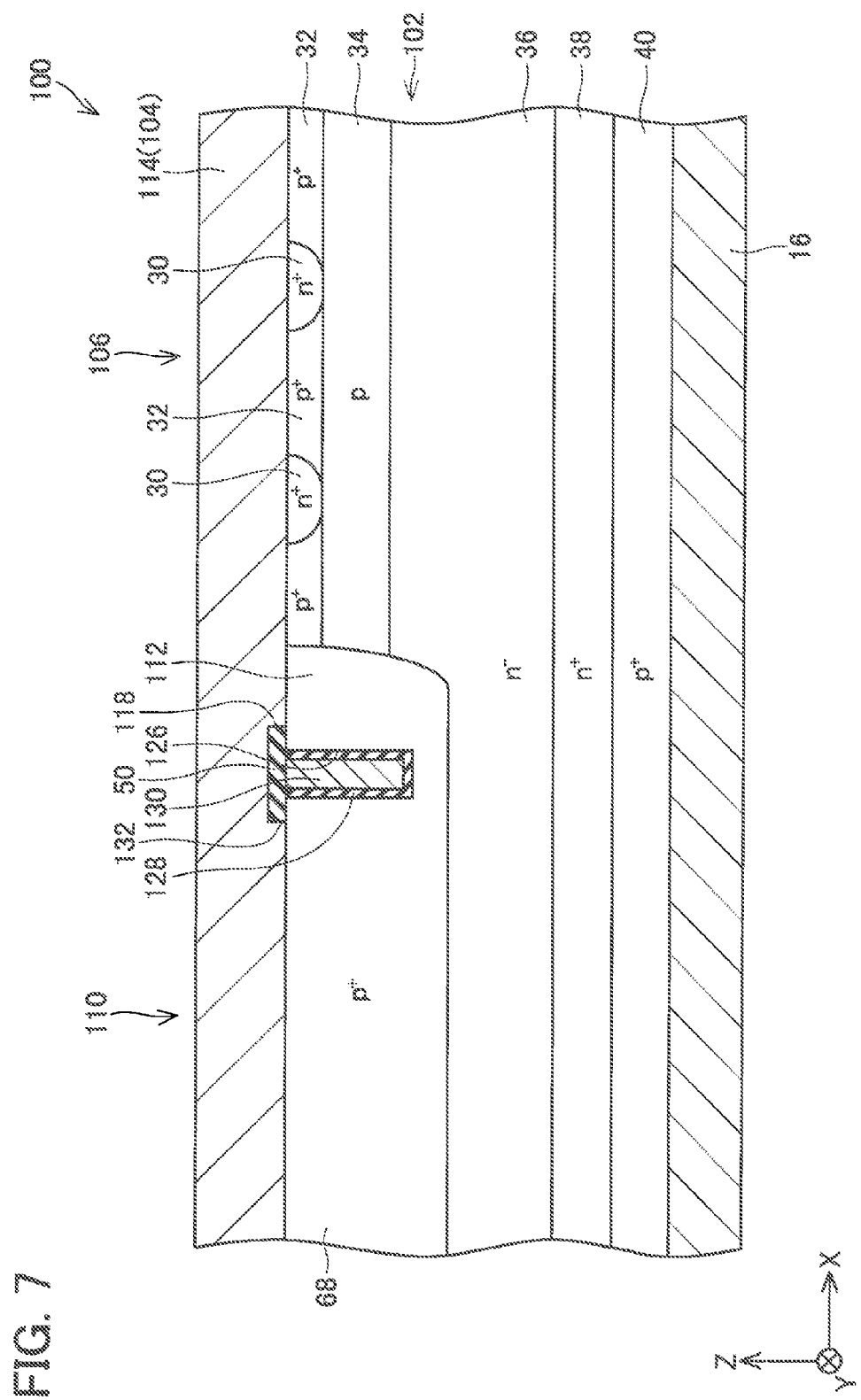
FIG. 7 is a cross-sectional view of the semiconductor device 100 of FIG. 5 as taken along the line VII-VII.

In the main region 106, as shown in FIGS. 6 and 7, an emitter layer 30, a high-concentration body layer 32, a low-concentration body layer 34, a drift layer 36, a buffer layer 38, a collector layer 40, and a well layer 112 are formed. On an upper surface of the main region 106, a main emitter electrode 114, which is part of the upper electrode 104, is formed.

In the upper surface of the semiconductor substrate 102 within the main region 106, a plurality of trenches 116 are formed. Each of the trenches 116 extends down to such a depth as to penetrate the emitter layer 30, the high-concentration body layer 32, and the low-concentration body layer 34 from the upper surface of the semiconductor substrate 102 and reach the drift layer 36. Inside each of the trenches 116, a gate electrode 48 is formed. The gate electrode 48 is insulated from the semiconductor substrate 102 by a gate insulating film 46, and is insulated from the main emitter electrode 114 by an interlayer insulating film 50. As shown in FIG. 5, each of the trenches 116 is formed in a linear shape extending in the X direction.

As shown in FIGS. 6 and 7, the emitter layer 30 and the high-concentration body layer 32 are in contact with the main emitter electrode 114 through a plurality of contact holes 118 formed in the interlayer insulating film 50. As shown in FIG. 5, each of the contact holes 118 is in the shape of a rectangle having long sides extending along the X direction and short sides extending along a Y direction. The contact holes 118 extend in the X direction for substantially the same length as the trenches 116. The contact holes 118 are placed side by side at predetermined intervals in the Y direction. The main emitter electrode 114 is disposed so as to almost entirely cover the main region 106.

As shown in FIGS. 5 and 7, the well layer 112 is formed in the vicinity of both ends of each of the trenches 116 in the X direction. The well layer 112 is a p-type semiconductor region. The well layer 112 is formed in such a range as to be exposed at the upper surface of the semiconductor substrate 102. The well layer 112 is formed so as to be deeper than the trenches 116. The p-type impurity concentration of the well layer 112 is substantially the same as the p-type impurity concentration of the well layer 68 of the well region 110. The well layer 112 is in contact with the main emitter electrode 114 through the contact holes 118.

Figure 8:
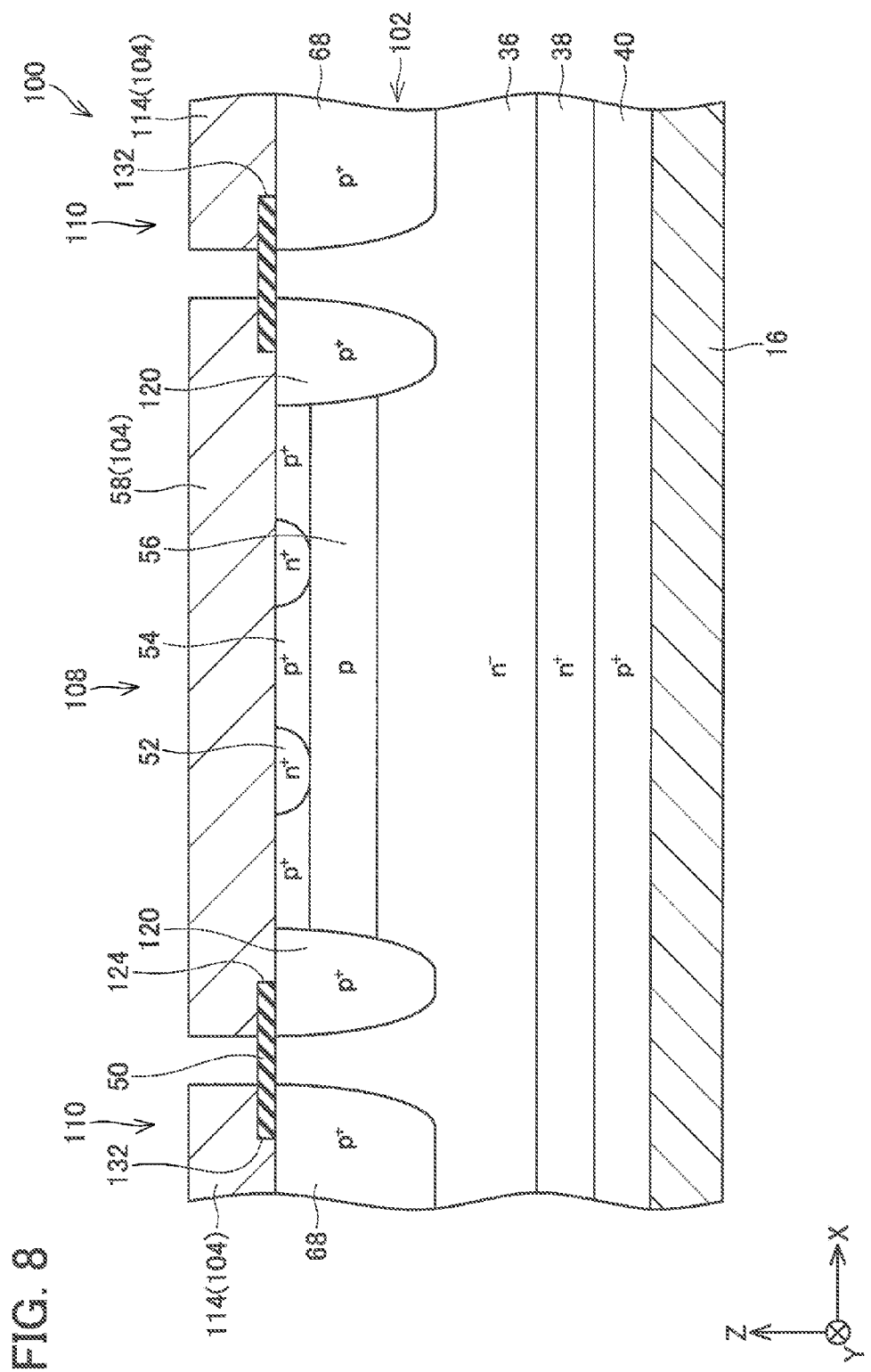
FIG. 8 is a cross-sectional view of the semiconductor device 100 of FIG. 5 as taken along the line VIII-VIII.
Figure 9:
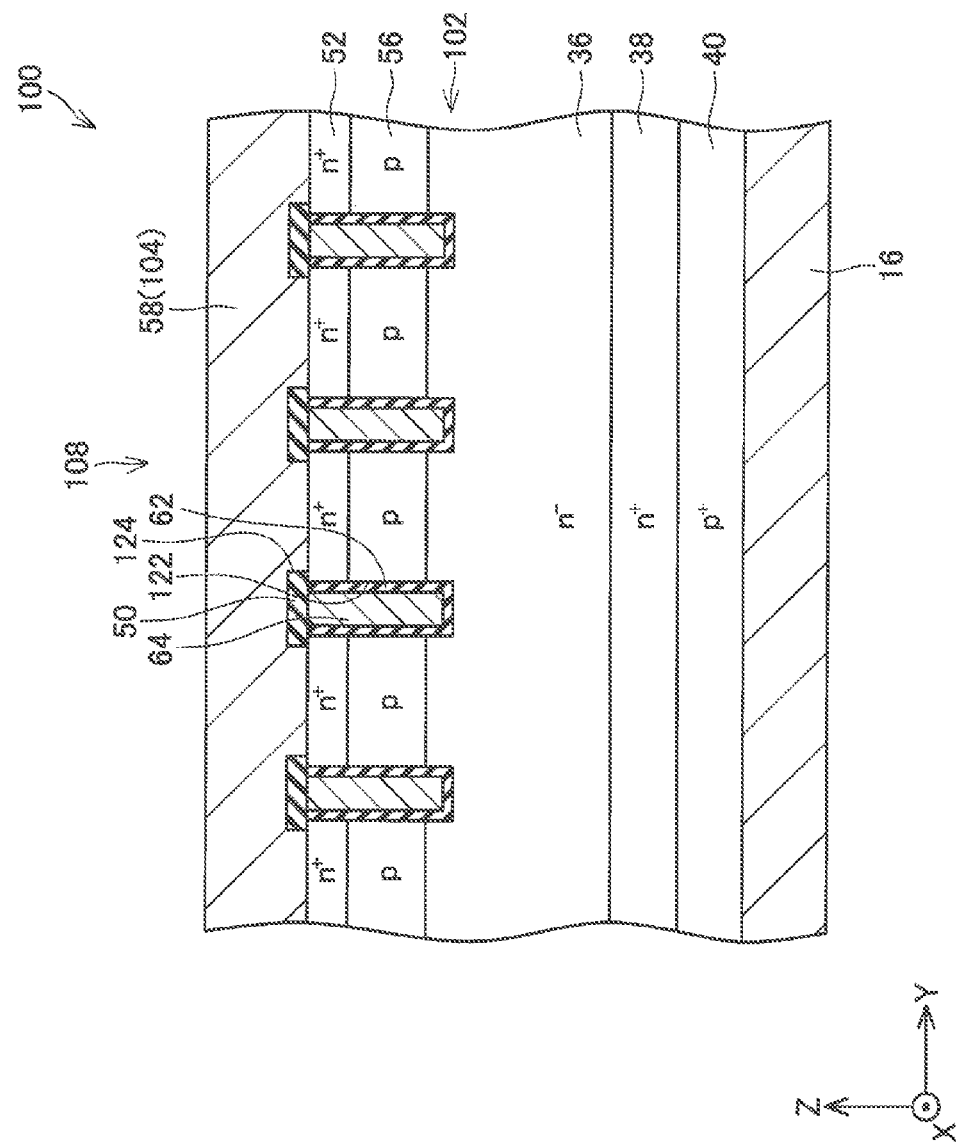
FIG. 9 is a cross-sectional view of the semiconductor device 100 of FIG. 5 as taken along the line IX-IX.

In the current sense region 108, as shown in FIGS. 8 and 9, an emitter layer 52, a high-concentration body layer 54, a low-concentration body layer 56, the drift layer 36, the buffer layer 38, the collector layer 40, and a well layer 120 are formed. On an upper surface of the current sense region 108, a current sense emitter electrode 58, which is part of the upper electrode 104, is formed.

In the upper surface of the semiconductor substrate 102 within the current sense region 108, a plurality of trenches 122 are formed. Each of the trenches 112 extends down to such a depth as to penetrate the emitter layer 52, the high-concentration body layer 54, and the low-concentration body layer 56 from the upper surface of the semiconductor substrate 102 and reach the drift layer 36. Inside each of the trenches 122, a gate electrode 64 is formed. The gate electrode 64 is insulated from the semiconductor substrate 102 by a gate insulating film 62, and is insulated from the current sense emitter electrode 58 by the interlayer insulating film 50. As shown in FIG. 5, each of the trenches 122 is formed in a linear shape extending in the X direction.

As shown in FIGS. 8 and 9, the emitter layer 52 and the high-concentration body layer 54 are in contact with the current sense emitter electrode 58 through a plurality of contact holes 124 formed in the interlayer insulating film 50. As shown in FIG. 5, each of the contact holes 124 is in the shape of a rectangle having long sides extending along the X direction and short sides extending along the Y direction. The contact holes 124 extend in the X direction for substantially the same length as the trenches 122. The contact holes 124 are placed side by side at predetermined intervals in the Y direction. The current sense emitter electrode 58 is disposed so as to almost entirely cover the current sense region 108.

The well layer 120 is formed in the vicinity of both ends of each of the trenches 122 in the X direction. The well layer 120 is a p-type semiconductor region. The well layer 120 is formed in such a range as to be exposed at the upper surface of the semiconductor substrate 102. The well layer 120 is formed so as to be deeper than the trenches 122. The p-type impurity concentration of the well layer 120 is higher than the p-type impurity concentration of the low-concentration body layer 56. Further, the p-type impurity concentration of the well layer 120 is such a concentration that when the IGBT of the current sense region 108 is in an off state, the well layer 120 is depleted only up to the same depth as the trenches 122. That is, in the well layer 120, a depletion layer does not extend to a position shallower than a lower end of each of the trenches 122. The well layer 120 is in contact with the current sense emitter electrode 58 through the contact holes 124.

In the well region 110, as shown in FIG. 7, the well layer 68, the drift layer 36, the buffer layer 38, and the collector layer 40 are formed. On an upper surface of the well region 110, a main emitter electrode 114 is formed. The main emitter electrode 114 continuously extends from the main emitter electrode 114 of the main region 106.

At a position where the well region 110 and the main region 106 are adjacent to each other, the well layer 68 is formed so as to be continuous with the well layer 112 of the main region 106. Further, at a position where the well region 110 and the main region 106 are adjacent to each other, a trench 126 for separating the well region 110 and the main region 106 from each other is formed. The trench 126 is formed down to a position deeper than a boundary of the low-concentration body layer 34 and the drift layer 36 of the main region 106 from the upper surface of the semiconductor substrate 102. The trench 126 is formed in a linear shape extending in the Y direction (i.e. a direction orthogonal to the X direction). An inner surface of the trench 126 is covered with a gate insulating film 128. Further, inside the trench 126, a gate electrode 130 is formed. The gate electrode 130 is insulated from the semiconductor substrate 102 by the gate insulating film 128. On top of the gate electrode 130, the interlayer insulating film 50 is formed. The gate electrode 130 is insulated from the main emitter electrode 114 by the interlayer insulating film 50.

The well layer 68 is in contact with the main emitter electrode 114 through a plurality of contact holes 132 formed in the interlayer insulating film 50. As shown in FIG. 5, each of the contact holes 132 is in the shape of a rectangle having long sides extending along the X direction and short sides extending along the Y direction. The contact holes 132 are placed side by side at predetermined intervals in the Y direction. The contact holes 132 are arranged in a pattern that is substantially identical to a pattern in which the contact holes 118 of the main region 106 are arranged. The main emitter electrode 114 is disposed so as to almost entirely cover the well region 110. It should be noted that in part of the well region 110, a gate pad placing section 74 on which to place a gate pad is formed. In the gate pad placing section 74, no contact holes 132 are formed in the interlayer insulating film 50, nor is a main emitter electrode 114 formed.

In this semiconductor device 100, the gate electrode 48 of the main region 106 and the gate electrode 64 of the current sense region 108 conduct with each other. Therefore, the IGBT of the main region 106 and the IGBT of the current sense region 108 are turned on at the same time. When the IGBTs are turned on, electrical currents flow through the main region 106 and the current sense region 108, respectively. The ratio between the electrical current flowing through the main region 106 and the electrical current flowing through the current sense region 108 is substantially equal to the ratio between the area of the main region 106 and the area of the current sense region 108. Therefore, the electrical current flowing through the main region 106 can be detected by detecting the electrical current flowing through the current sense region 108.

When the IGBT of the main region 106 and the IGBT of the current sense region 108 are turned off, the drift layer 36 is depleted, so that a high voltage is applied to the drift layer 36. In the semiconductor device 100 of the present embodiment, the well layer 68, which is deeper than the trenches 116 of the main region 106 and the trenches 122 of the current sense region 108, is formed in the well region 110. This causes a distribution of potentials through the drift layer 36 in the well region 110 to become flat for uniform electric field when the IGBTs are off. This makes it possible to make the withstand voltage of the semiconductor device 100 higher without providing a trench in the well region 110.

The semiconductor device 100 of the present embodiment is configured such that the well layer 68 and the main emitter electrode 114 are in contact with each other through the contact holes 132 formed in the interlayer insulating film 50 of the well region 110. This configuration allows carriers flowing out of the main region 106 into the well region 110 to quickly exit through the contact holes 132 to the main emitter electrode 114. This makes it hard for current crowding to be effected in a specific location, thus making it possible to enhance breakdown resistance at the time of an avalanche breakdown or at the time of a short circuit.

The semiconductor device 100 of the present embodiment is configured such that the well region 110 is formed so as to surround the current sense region 108 in a plan view of the semiconductor substrate 102. This configuration uniforms a current distribution around the current sense region 108, thereby making it possible to improve detection accuracy in the current sense region 108.

The semiconductor device 100 of the present embodiment is configured such that in the main region 106, the well layer 112 is formed in the vicinity of both ends of each of the trenches 116 in the X direction. This configuration suppresses the concentration of electric fields in the vicinity of both ends of each of the trenches 116 in the X direction, thereby making it possible to make the withstand voltage of the semiconductor device 100 higher.

The semiconductor device 100 of the present embodiment is configured such that in the current sense region 108, the well layer 120 is formed in the vicinity of both ends of each of the trenches 122 in the X direction. This configuration suppresses the concentration of electric fields in the vicinity of both ends of each of the trenches 122 in the X direction, thereby making it possible to make the withstand voltage of the semiconductor device 100 higher.

The semiconductor device 100 of the present embodiment is configured such that at a position where the well region 110 and the main region 106 are adjacent to each other, the trench 126 for separating the well region 110 and the main region 106 from each other is formed. This configuration interrupts a current pathway between the main region 106 and the current sense region 108 via the well region 110, thereby making it possible to improve detection accuracy in the current sense region 108. It should be noted the gate electrode 130 inside the trench 126 may be connected to the gate electrode 48 of the main region 106 in an external circuit, or may be connected to another potential. Alternatively, the inside of the trench 126 may be filled with a gate insulating film 128 without the formation of the gate electrode 130 inside the trench 126.

The semiconductor device 100 of the present embodiment is configured such that the main emitter electrode 114 of the main region 106 continuously extends to the upper surface of the well region 110. This configuration allows carriers flowing out of the main region 106 into the well region 110 to more quickly exit than in the case where a well region electrode separate from the main emitter electrode 114 is formed on the upper surface of the well region 110. This makes it possible to better uniform a current distribution in the well region 110.

Embodiment 3

Figure 11:
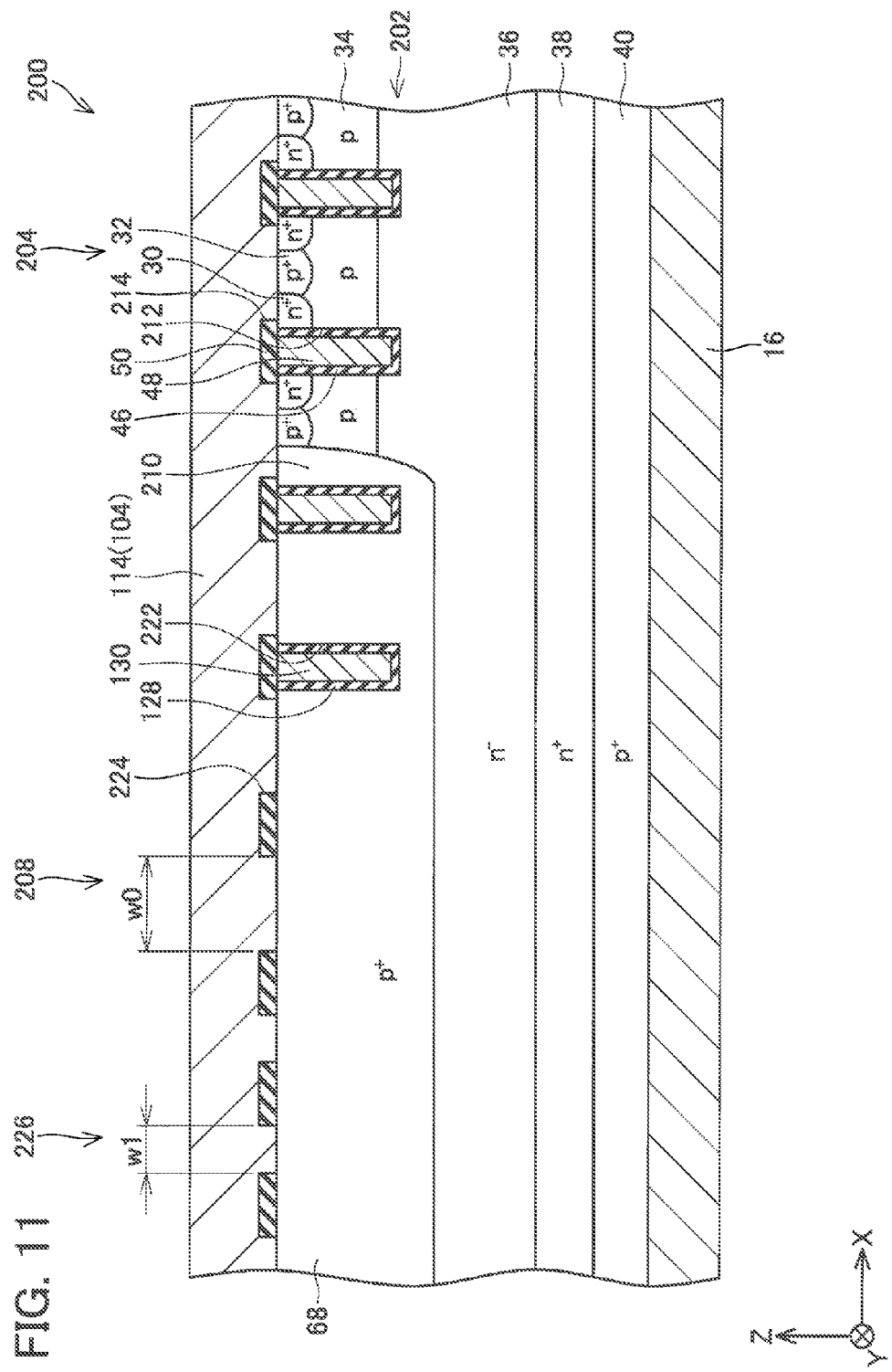
FIG. 11 is a cross-sectional view of the semiconductor device 200 of FIG. 10 as taken along the line XI-XI.
Figure 12:
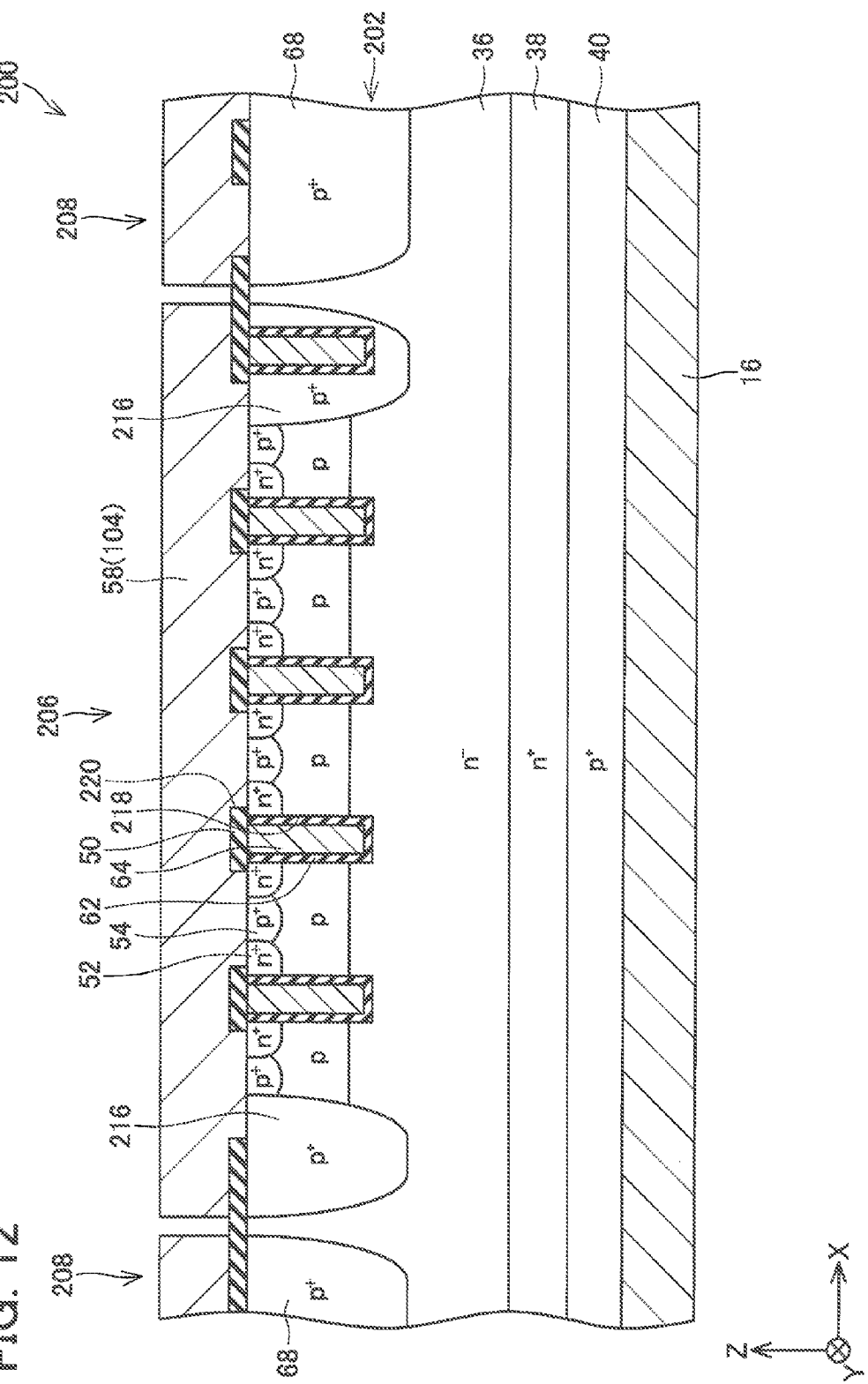
FIG. 12 is a cross-sectional view of the semiconductor device 200 of FIG. 10 as taken along the line XII-XII.

A semiconductor device 200 of the present embodiment is described below with reference to FIGS. 10 to 12. It should be noted that those components of the semiconductor device 200 of the present embodiment which are the same as those of the semiconductor device 10 of Embodiment 1 or those of the semiconductor device 100 of Embodiment 2 are given the same reference signs, and as such, are not described below in detail. As shown in FIGS. 11 and 12, the semiconductor device 200 includes a semiconductor substrate 202, an upper electrode 104, and a lower electrode 16.

Figure 10:
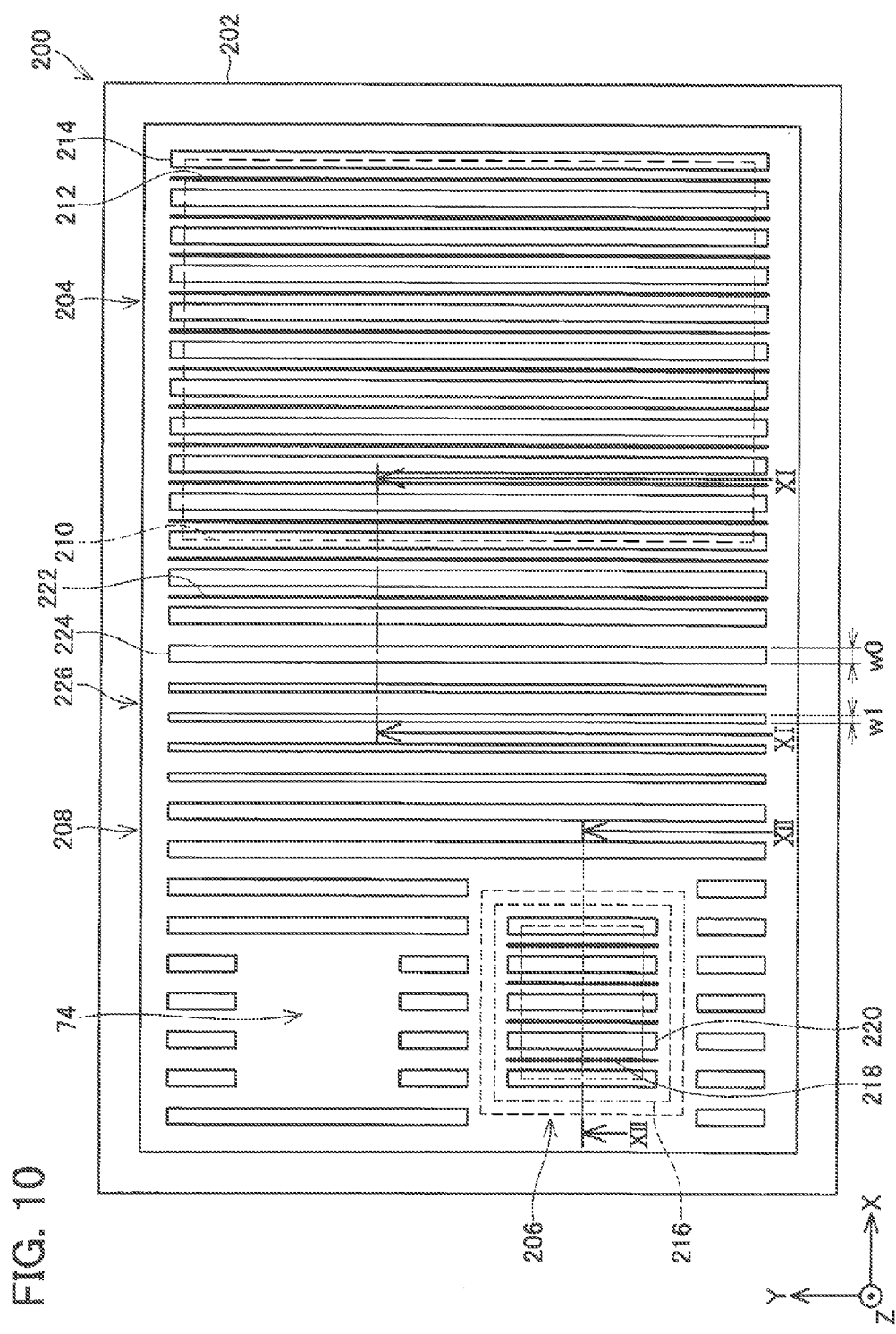
FIG. 10 is a plan view of a semiconductor device 200 of Embodiment 3.

As shown in FIG. 10, the semiconductor substrate 202 includes a main region 204, a current sense region 206, a well region 208, and a peripheral region 26. The main region 204 and the current sense region 206 both function as IGBTs. The main region 204 and the well region 208 are disposed adjacent to each other in an X direction (i.e. a left-to-right direction of FIG. 10). Further, the well region 208 is disposed so as to surround the current sense region 206. That is, the well region 208 can be said to be interposed between the main region 204 and the current sense region 206. Further, the main region 204, the well region 208, and the current sense region 206 can be said to be disposed side by side in the X direction. The peripheral region 26 is disposed so as to surround the main region 204, the current sense region 206, and the well region 208. That is, the well region 208 can be said to be interposed between the current sense region 206 and the peripheral region 26.

In the main region 204, as shown in FIG. 11, an emitter layer 30, a high-concentration body layer 32, a low-concentration body layer 34, a drift layer 36, a buffer layer 38, a collector layer 40, and a well layer 210 are formed. On an upper surface of the main region 204, a main emitter electrode 114, which is part of the upper electrode 104, is formed.

In the upper surface of the semiconductor substrate 202 within the main region 204, a plurality of trenches 212 are formed. Each of the trenches 212 extends down to such a depth as to penetrate the emitter layer 30, the high-concentration body layer 32, and the low-concentration body layer 34 from the upper surface of the semiconductor substrate 202 and reach the drift layer 36. Inside each of the trenches 212, a gate electrode 48 is formed. The gate electrode 48 is insulated from the semiconductor substrate 202 by a gate insulating film 46, and is insulated from the main emitter electrode 114 by an interlayer insulating film 50. As shown in FIG. 10, each of the trenches 212 is formed in a linear shape extending in a Y direction (i.e. a bottom-to-top direction of FIG. 10).

As shown in FIG. 11, the emitter layer 30 and the high-concentration body layer 32 are in contact with the main emitter electrode 114 through a plurality of contact holes 214 formed in the interlayer insulating film 50. As shown in FIG. 10, each of the contact holes 214 is in the shape of a rectangle having long sides extending along the Y direction and short sides extending along the X direction. The contact holes 214 extend in the Y direction for substantially the same length as the trenches 212. The contact holes 214 are placed side by side at predetermined intervals in the X direction. The main emitter electrode 114 is disposed so as to almost entirely cover the main region 204.

As shown in FIGS. 10 and 11, the well layer 210 of the main region 204 is formed in the vicinity of an outer edge of the main region 204, including the vicinity of both ends of each of the trenches 212 in the Y direction. The well layer 210 is a p-type semiconductor region. The well layer 210 is formed in such a range as to be exposed at the upper surface of the semiconductor substrate 202. The well layer 210 is formed so as to be deeper than the trenches 212. The p-type impurity concentration of the well layer 210 is substantially the same as the p-type impurity concentration of the well layer 68 of the well region 208. The well layer 210 is in contact with the main emitter electrode 114 through the contact holes 214.

In the current sense region 206, as shown in FIG. 12, an emitter layer 52, a high-concentration body layer 54, a low-concentration body layer 56, the drift layer 36, the buffer layer 38, the collector layer 40, and a well layer 216 are formed. On an upper surface of the current sense region 206, a current sense emitter electrode 58, which is part of the upper electrode 104, is formed.

In the upper surface of the semiconductor substrate 202 within the current sense region 206, a plurality of trenches 218 are formed. Each of the trenches 218 extends down to such a depth as to penetrate the emitter layer 52, the high-concentration body layer 54, and the low-concentration body layer 56 from the upper surface of the semiconductor substrate 202 and reach the drift layer 36. Inside each of the trenches 218, a gate electrode 64 is formed. The gate electrode 64 is insulated from the semiconductor substrate 202 by a gate insulating film 62, and is insulated from the current sense emitter electrode 58 by the interlayer insulating film 50. As shown in FIG. 10, each of the trenches 218 is formed in a linear shape extending in the Y direction.

As shown in FIG. 12, the emitter layer 52 and the high-concentration body layer 54 are in contact with the current sense emitter electrode 58 through a plurality of contact holes 220 formed in the interlayer insulating film 50. As shown in FIG. 10, each of the contact holes 220 is in the shape of a rectangle having long sides extending along the Y direction and short sides extending along the X direction. The contact holes 220 extend in the Y direction for substantially the same length as the trenches 218. The contact holes 220 are placed side by side at predetermined intervals in the X direction. The current sense emitter electrode 58 is disposed so as to almost entirely cover the current sense region 206.

As shown in FIGS. 10 and 12, the well layer 216 of the current sense region 206 is formed in the vicinity of an outer edge of the current sense region 206, including the vicinity of both ends of each of the trenches 218 in the Y direction. The well layer 216 is a p-type semiconductor region. The well layer 216 is formed in such a range as to be exposed at the upper surface of the semiconductor substrate 202. The well layer 216 is formed so as to be deeper than the trenches 218. The p-type impurity concentration of the well layer 216 is higher than the p-type impurity concentration of the low-concentration body layer 56. Further, the p-type impurity concentration of the well layer 216 is such a concentration that when the IGBT of the current sense region 206 is in an off state, the well layer 216 is depleted only up to the same depth as the trenches 218. That is, in the well layer 216, a depletion layer does not extend to a position shallower than a lower end of each of the trenches 218. The well layer 216 is in contact with the current sense emitter electrode 58 through the contact holes 220.

In the well region 208, as shown in FIG. 11, the well layer 68, the drift layer 36, the buffer layer 38, and the collector layer 40 are formed. On an upper surface of the well region 208, a main emitter electrode 114 is formed. The main emitter electrode 114 continuously extends from the main emitter electrode 114 of the main region 204.

At a position where the well region 208 and the main region 204 are adjacent to each other, the well layer 68 is formed so as to be continuous with the well layer 210 of the main region 204. Further, at a position where the well region 208 and the main region 204 are adjacent to each other, a trench 222 for separating the well region 208 and the main region 204 from each other is formed. The trench 222 is formed down to a position deeper than a boundary of the low-concentration body layer 34 and the drift layer 36 of the main region 204 from the upper surface of the semiconductor substrate 202. The trench 222 is formed in a linear shape extending in the Y direction (i.e. a direction orthogonal to the X direction). An inner surface of the trench 222 is covered with a gate insulating film 128. Further, inside the trench 222, a gate electrode 130 is formed. The gate electrode 130 is insulated from the semiconductor substrate 202 by the gate insulating film 128. On top of the gate electrode 130, the interlayer insulating film 50 is formed. The gate electrode 130 is insulated from the main emitter electrode 114 by the interlayer insulating film 50.

The well layer 68 is in contact with the main emitter electrode 114 through a plurality of contact holes 224 formed in the interlayer insulating film 50. As shown in FIG. 10, each of the contact holes 224 is in the shape of a rectangle having long sides extending along the Y direction and short sides extending along the X direction. The contact holes 224 are placed side by side at predetermined intervals in the X direction. The contact holes 224 are arranged in a pattern that is substantially identical to a pattern in which the contact holes 214 of the main region 204 are arranged, except for a distance adjusting section 226. The width w1 in the X direction of each of those ones of the contact holes 224 in the distance adjusting section 226 is smaller than the width w0 in the X direction of each of those ones of the contact holes 224 in other parts. It should be noted that in part of the well region 208, a gate pad placing section 74 on which to place a gate pad is formed. In the gate pad placing section 74, no contact holes 224 are formed in the interlayer insulating film 50, nor is a main emitter electrode 114 formed.

In this semiconductor device 200, the gate electrode 48 of the main region 208 and the gate electrode 64 of the current sense region 206 conduct with each other. Therefore, the IGBT of the main region 204 and the IGBT of the current sense region 206 are turned on at the same time. When the IGBTs are turned on, electrical currents flow through the main region 204 and the current sense region 206, respectively. The ratio between the electrical current flowing through the main region 204 and the electrical current flowing through the current sense region 206 is substantially equal to the ratio between the area of the main region 204 and the area of the current sense region 206. Therefore, the electrical current flowing through the main region 204 can be detected by detecting the electrical current flowing through the current sense region 206.

When the IGBT of the main region 204 and the IGBT of the current sense region 206 are turned off, the drift layer 36 is depleted, so that a high voltage is applied to the drift layer 36. In the semiconductor device 200 of the present embodiment, the well layer 68, which is deeper than the trenches 212 of the main region 204 and the trenches 218 of the current sense region 206, is formed in the well region 208. This causes a distribution of potentials through the drift layer 36 in the well region 208 to become flat for uniform electric field when the IGBTs are off. This makes it possible to make the withstand voltage of the semiconductor device 200 higher without providing a trench in the well region 208.

The semiconductor device 200 of the present embodiment is configured such that the well layer 68 and the main emitter electrode 114 are in contact with each other through the contact holes 220 formed in the interlayer insulating film 50 of the well region 208. This configuration allows carriers flowing out of the main region 204 into the well region 208 to quickly exit through the contact holes 220 to the main emitter electrode 114. This makes it hard for current crowding to be effected in a specific location, thus making it possible to enhance breakdown resistance at the time of an avalanche breakdown or at the time of a short circuit.

The semiconductor device 200 of the present embodiment is configured such that the well region 208 is formed so as to surround the current sense region 206 in a plan view of the semiconductor substrate 202. This configuration uniforms a current distribution around the current sense region 206, thereby making it possible to improve detection accuracy in the current sense region 206.

The semiconductor device 200 of the present embodiment is configured such that regarding the contact holes 224 formed in the interlayer insulating film 50 of the well region 208, the width w1 in the X direction of each of those ones of the contact holes 224 in the distance adjusting section 226 is smaller than the width w0 in the X direction of each of those ones of the contact holes 224 in other parts. This configuration makes it possible to, by adjusting the width in the X direction of each of those ones of the contact holes 224 in the distance adjusting section 226, finely adjust the relative position in the X direction of the current sense region 206 with respect to the main region 204 without effecting a great fluctuation in a current distribution in the well region 208. Preferably, the width w1 in the X direction of each of those ones of the contact holes 224 in the distance adjusting section 226 is adjusted to fall within a range of ±30% of the width w0 in the X direction of each of those ones of the contact holes 224 in other parts. It should be noted that the relative position in the X direction of the current sense region 206 with respect to the main region 204 may be finely adjusted by, varying the interval between adjacent contact holes 224 in the X direction in the distance adjusting section 226 instead of varying the width in the X direction of each of those ones of the contact holes 224 in the distance adjusting section 226 as described above.

The semiconductor device 200 of the present embodiment is configured such that the well layer 210 is formed in the vicinity of the outer edge of the main region 204. This configuration suppresses the concentration of electric fields in the vicinity of the outer edge of the main region 204, thereby making it possible to make the withstand voltage of the semiconductor device 200 higher.

The semiconductor device 200 of the present embodiment is configured such that the well layer 216 is formed in the vicinity of the outer edge of the current sense region 206. This configuration suppresses the concentration of electric fields in the vicinity of the outer edge of the current sense region 206, thereby making it possible to make the withstand voltage of the semiconductor device 200 higher.

The semiconductor device 200 of the present embodiment is configured such that at a position where the well region 208 and the main region 204 are adjacent to each other, the trench 222 for separating the well region 208 and the main region 204 from each other is formed. This configuration interrupts a current pathway between the main region 204 and the current sense region 206 via the well region 208, thereby making it possible to improve detection accuracy in the current sense region 206. It should be noted the gate electrode 130 inside the trench 222 may be connected to the gate electrode 48 of the main region 204 in an external circuit, or may be connected to another potential. Alternatively, the inside of the trench 222 may be filled with the gate insulating film 128 without the formation of the gate electrode 130 inside the trench 222.

The semiconductor device 200 of the present embodiment is configured such that the main emitter electrode 114 of the main region 204 continuously extends to the upper surface of the well region 208. This configuration allows carriers flowing out of the main region 204 into the well region 208 to more quickly exit than in the case where a well region electrode separate from the main emitter electrode 114 is formed on the upper surface of the well region 208. This makes it possible to further uniform a current distribution in the well region 208.

The semiconductor device 200 of the present embodiment is configured such that the trenches 212 of the main region 204 extend along the Y direction. This configuration uniforms the flow of carriers flowing out of the main region 204 into the well region 208, thereby making it possible to even further uniform the current distribution in the well region 208.

What is claimed is:
1. A semiconductor device, comprising:
   a semiconductor substrate comprising a main region, a current sense region, and a well region disposed between the main region and the current sense region;
   a main emitter electrode disposed above the main region of the semiconductor substrate;
   a current sense emitter electrode disposed above the current sense region of the semiconductor substrate;
   a well region electrode disposed above the well region of the semiconductor substrate; and
   a lower electrode disposed below the semiconductor substrate, wherein each of the main region and the current sense region comprises:

a first conductivity type emitter layer exposed at an upper surface of the semiconductor substrate;

a second conductivity type body layer disposed below the emitter layer and exposed at the upper surface of the semiconductor substrate;

a first conductivity type drift layer disposed below the body layer;

a gate electrode disposed inside a trench penetrating the body layer from the upper surface of the semiconductor substrate and reaching the drift layer;

a gate insulating film insulating the gate electrode and a wall of the trench; and an interlayer insulating film formed between the upper surface of the semiconductor substrate and a corresponding one of the main emitter electrode and the current sense emitter electrode, and insulating the gate electrode and the corresponding one of the main emitter electrode and the current sense emitter electrode, wherein the well region comprises:

a second conductivity type well layer exposed at the upper surface of the semiconductor substrate and having a depth, which is from the upper surface of the semiconductor substrate to a lower end of the well layer, deeper than the trench of the main region;

a first conductivity type drift region disposed below the well layer and being continuous with the drift layer of the main region and the drift region of the current sense region; and an interlayer insulating film formed between the upper surface of the semiconductor substrate and the well region electrode, and wherein the well layer and the well region electrode are in contact with each other through a contact hole formed in the interlayer insulating film of the well region.

2. A semiconductor device as in claim 1, wherein the well region is disposed so as to surround the current sense region in a plan view of the semiconductor substrate.

3. A semiconductor device as in claim 1, wherein when an X direction is defined as a direction in which the main region, the well region and the current sense region are disposed side by side, a plurality of contact holes are formed in a pattern repeated at a predetermined pitch in the X direction in the interlayer insulating film of the main region, and some of the contact holes in the interlayer insulating film of the well region are formed in a pitch pattern different from the predetermined pitch, and rest of the contact holes are formed in the pattern repeated at the predetermined pitch in the X direction.

4. A semiconductor device as in claim 1, wherein when an X direction is defined as a direction in which the main region, the well region and the current sense region are disposed side by side, a trench having a depth deeper than a boundary of the body region and the drift region of the main region is formed along a direction orthogonal to the X direction at a portion where the main region and the well region are adjacent to each other.

5. A semiconductor device as in claim 1, wherein the current sense region further comprises a second conductivity type well layer exposed at the upper surface of the semiconductor substrate and having a depth, which is from the upper surface of the semiconductor substrate to a lower end of the well layer, deeper than the trench of the current sense region, and the well layer of the current sense region is disposed at a portion where the current sense region and the well region are adjacent to each other, and separated from the well layer of the well region via the drift layer.

* * * * *